United States Patent [19]

Baumbaugh

[11] Patent Number: 5,626,480

[45] Date of Patent: May 6, 1997

[54] HIGH DENSITY PRINTED ELECTRICAL CIRCUIT BOARD CARD CONNECTION SYSTEM

[75] Inventor: Alan E. Baumbaugh, Aurora, Ill.

[73] Assignee: Universities Research Association, Inc., Washington, D.C.

[21] Appl. No.: 490,674

[22] Filed: Jun. 15, 1995

[51] Int. Cl.[6] ........................................... H01R 9/09
[52] U.S. Cl. .................. 439/64; 439/260; 439/266; 439/267
[58] Field of Search ........................ 439/64, 260, 266, 439/267

[56] References Cited

U.S. PATENT DOCUMENTS

| | | | |
|---|---|---|---|
| 3,495,132 | 2/1970 | Etal | 439/64 |
| 4,047,782 | 9/1977 | Yeager | 439/64 |
| 4,390,224 | 6/1983 | Showman et al. | 439/260 |
| 4,553,803 | 11/1985 | Lapraik et al. | 439/267 |
| 4,603,928 | 8/1986 | Evans . | |
| 4,606,594 | 8/1986 | Grabbe et al. | 439/267 |
| 4,744,764 | 5/1988 | Rubenstein | 439/260 |
| 4,818,240 | 4/1989 | Karner . | |
| 4,834,665 | 5/1989 | Kreinberg et al. . | |
| 4,846,699 | 7/1989 | Glover et al. . | |
| 5,086,372 | 2/1992 | Bennett et al. . | |

FOREIGN PATENT DOCUMENTS

| | | | |
|---|---|---|---|
| 8502499 | 6/1985 | Australia | 439/266 |

*Primary Examiner*—David L. Pirlot
*Assistant Examiner*—Tho Dac Ta
*Attorney, Agent, or Firm*—McAndrews, Held & Malloy, Ltd.

[57] ABSTRACT

A zero insertion/extraction force printed circuit board card connection system comprises a cam-operated locking mechanism disposed along an edge portion of the printed circuit board. The extrusions along the circuit board mate with an extrusion fixed to the card cage having a plurality of electrical connectors. The card connection system allows the connectors to be held away from the circuit board during insertion/extraction and provides a constant mating force once the circuit board is positioned. The card connection system provides a simple solution to the need for a greater number of electrical signal connections.

9 Claims, 3 Drawing Sheets

FIG. 6
FIG. 7
FIG. 8
FIG. 8A
FIG. 8B
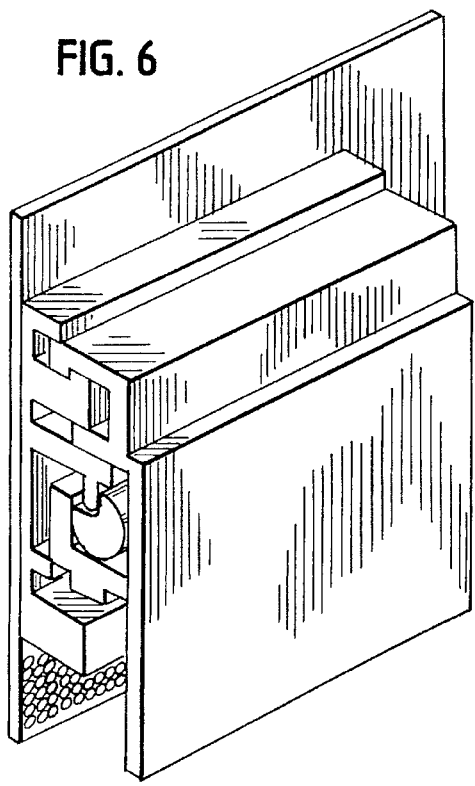
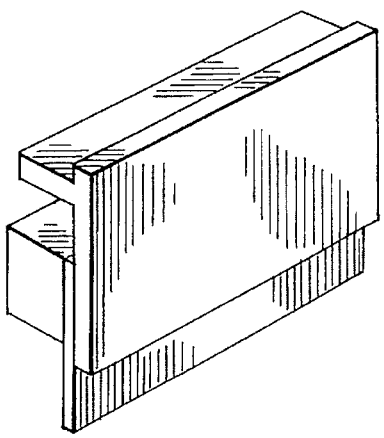
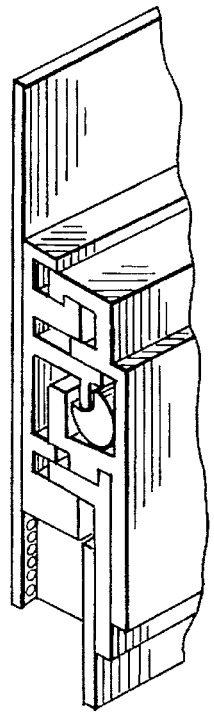
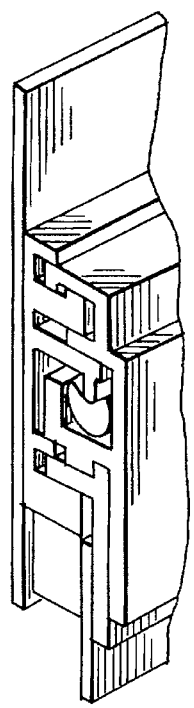
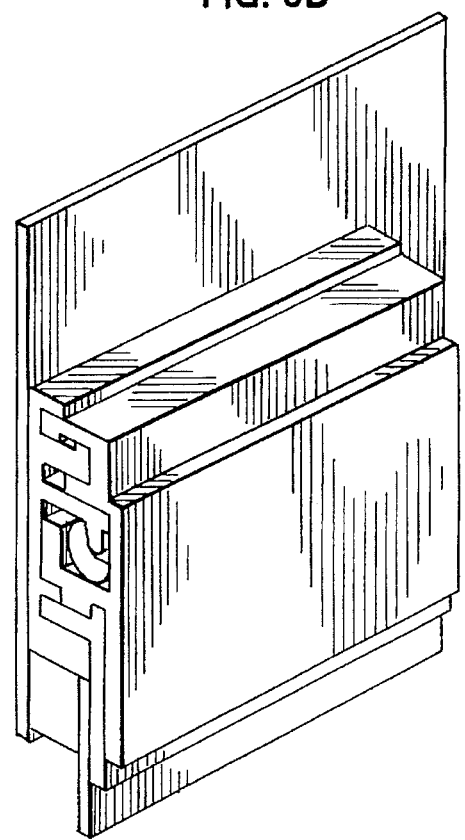

HIGH DENSITY PRINTED ELECTRICAL CIRCUIT BOARD CARD CONNECTION SYSTEM

This invention was made with Government support under Government Contract No. DE-AC02-76CH03000 awarded by the U.S. Department of Energy. The Government has certain rights in the invention.

FIELD OF THE INVENTION

The present invention relates to electrical connectors for removable printed circuit boards. More particularly, the present invention relates to a zero insertion/extraction force connector disposed along an edge of a printed circuit board capable of supplying 1000 or more electrical signal connections.

BACKGROUND OF THE INVENTION

As computational demands increase, there is a growing need for a large number, i.e., greater than 600, of electrical signal connections for removable printed circuit boards. Typically, removable printed circuit boards are inserted into a card cage or expansion slot of a computer. Often, these printed circuit boards, or daughter cards, are connected to the mother board of a computer through the backplane of the card cage. Electrical circuitry on the circuit boards connect to the backplane by any of several types of known connectors and terminals. The circuit boards are thereby interconnected by the backplane to circuitry of other circuit boards in the array of slots and/or to other circuitry within the computer. The circuit boards are, therefore, limited by the number of electrical connections available on the backplane.

For example, printed circuit boards of the Eurocard 9 U by 400 mm format have three 96 pin DIN connectors along their back edge. Most of these connections are dedicated to VME signal lines and power supplies. Thus, at most, approximately 100 connections are available for non-standard power supplies and signal connections. The complexity of today's electronics demand more connections to exchange power and electrical signals.

One solution is to add connections to the front of the circuit board. Adding connections to the front edge of the circuit board is possible, however, it is not practical for large systems. The associated cabling would make circuit board removal and replacement very difficult.

The present printed circuit board card connection system addresses this need for increased signal connections with a simple mechanical arrangement.

It is therefore an object of the present invention to provide a card connection system having 1000 or more electrical signal connections disposed along an edge of a printed circuit board, other than the back edge.

Another object of the present invention is to provide electrical connections which are able to be mated after insertion, yet separable during circuit board insertion and extraction.

A further object of the present invention is to provide a card connection system which provides adequate ventilation when a plurality of circuit boards including the present connection system are installed as an array within a card cage.

SUMMARY OF THE INVENTION

The above and other objects are achieved by a large scale, high density electrical printed circuit board card connection system which includes a cam-operated zero insertion/extraction force connector disposed along an entire edge portion of a printed circuit board.

In one embodiment of the present card connection system, an electrical connector for introducing electrical signals to a circuit board comprises:

(a) a first extrusion fixedly attached to an edge portion of a circuit board having a plurality of electrical signal receiving locations along an edge thereof, the first extrusion having a cam surface;

(b) a second extrusion coupled to the first extrusion, the first and second extrusions defining an interior channel open at one end;

(c) a cam member disposed between the first and second extrusions rotatably engaging the cam surface such that rotation of the cam member urges the second extrusion between a first and second position; and, (d) a third extrusion fixedly attached to a housing for receiving a circuit board, the third extrusion slidably engaging the channel, the third extrusion further including a plurality of electrical contacts.

In operation, movement of the second extrusion into the first position urges the plurality of electrical contacts apart from the plurality of electrical signal receiving locations and movement of the second extrusion into the second position urges the plurality of electrical contacts to engage the plurality of electrical signal receiving locations.

A method of providing electrical connections to a circuit board comprises the steps of:

(a) fixedly attaching a first extrusion to an edge portion of a circuit board having a plurality of electrical signal receiving locations along an edge thereof, the first extrusion having a cam surface;

(b) mating a second extrusion to the first extrusion, the first and second extrusions defining an interior channel open at one end;

(c) positioning a cam member between the first and second extrusions rotatably engaging the cam surface such that rotation of the cam member urges the second extrusion between a first and second position;

(d) fixedly attaching a third extrusion to a housing for receiving a circuit board, the third extrusion having a plurality of electrical contacts;

(e) rotating the cam member to urge the second extrusion into the first position then inserting the third extrusion into the channel such that the plurality of electrical contacts align with and oppose the plurality of electrical signal receiving locations; and, (f) rotating the cam member to urge the second extrusion into the second position such that the plurality of electrical contacts engage the plurality of electrical signal receiving locations.

BRIEF DESCRIPTION OF THE DRAWINGS

FIG. 6 is a partial isometric view of the cam-operated connector taken in the direction of arrows 2—2 in FIG. 1.

FIG. 7 is a partial isometric view of an extrusion fixed to the card cage.

FIG. 8 is a partial isometric view of the card connection system of the present invention in the insertion/extraction position.

FIG. 8A is a partial isometric view of the card connection system of FIG. 8 with the cam member partially rotated.

FIG. 8B is a partial isometric view of the card connection system of FIG. 8 with the cam member fully rotated and the electrical contacts engaged.

DETAILED DESCRIPTION OF THE PREFERRED EMBODIMENTS

In the present application, spatially orienting terms are used such as "front," "top," "bottom," "back" and the like. It is to be understood that these terms are used for convenience of description of the preferred embodiments by reference to the drawings. These terms do not necessarily describe the absolute location in space, such as front, top, bottom, upward, downward, and the like, that any part must assume.

Figure 1:
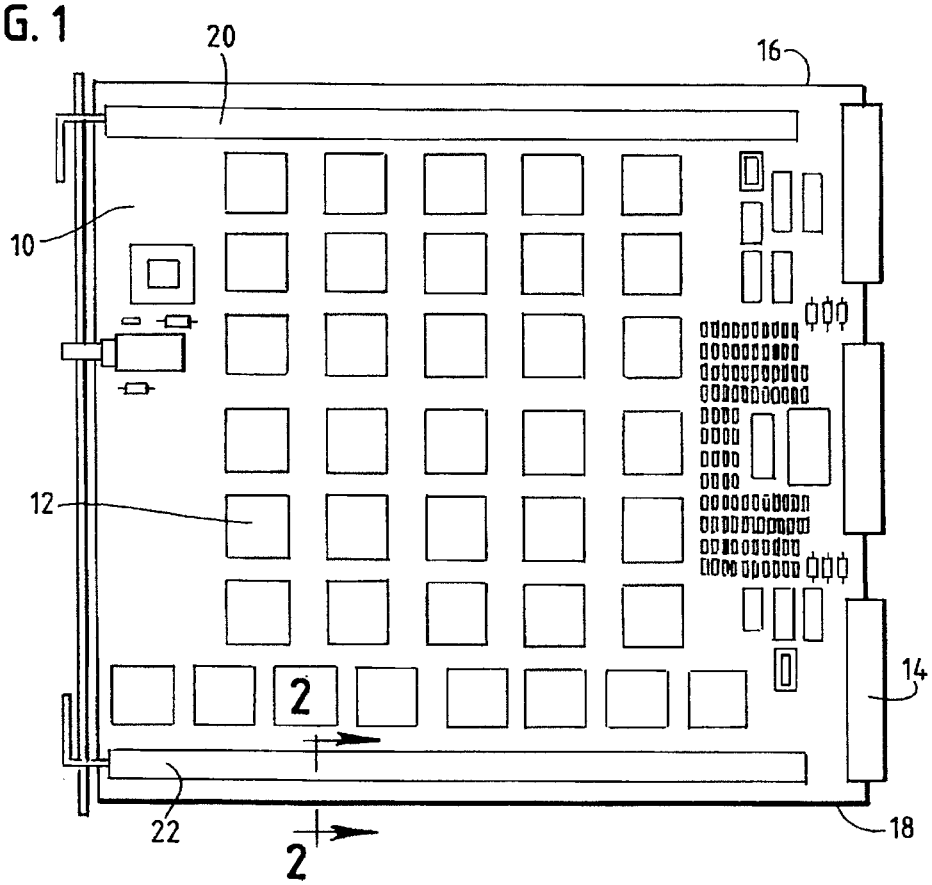
FIG. 1 is a side view of a circuit board including the card connection system of the present invention.

FIG. 1 shows a representative printed circuit board 10 having a plurality of integrated circuit chips 12 attached thereto. In standard 9 U by 400 mm (14.437 by 15.750 inch) Eurocard format, for example, three 96 pin DIN connectors 14 are provided along the back edge of the printed circuit board 10. Typically, most of the connections provided by the DIN connectors 14 are used for VME signal lines and power supplies. Thus, there are relatively few connections available for non-standard power supplies or signal lines. The printed circuit board 10 includes upper and lower card guide areas 16 and 18. The card guides 16, 18 provide a flange for inserting into corresponding slots 50 in a card cage. The printed circuit board 10 can thus be mounted in a card cage by inserting the card guides 16, 18 into their respective slots 50 and sliding the printed circuit board 10 until the DIN connectors 14 engage the backplane of the card cage.

Figure 2:
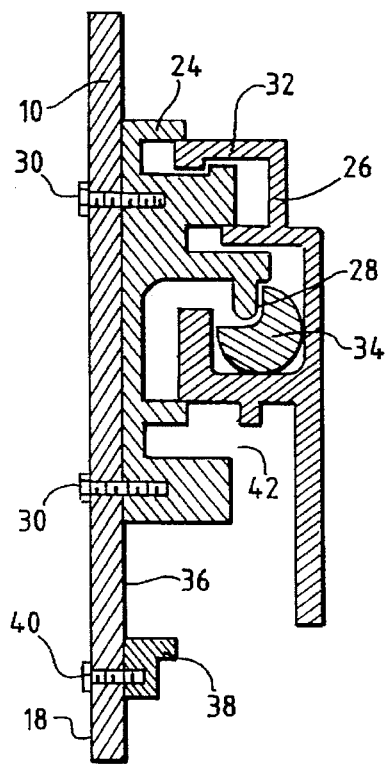
FIG. 2 is section view of the cam-operated connector, taken in the direction of arrows 2—2 in FIG. 1.

In order to provide additional electrical contacts, the printed circuit board 10 includes upper and lower cam-operated connectors 20, 22. FIG. 2 is a section view of the cam-operated connector of FIG. 1 taken along line 2—2.

Referring to FIG. 2, the printed circuit board 10 is shown having first and second extrusions 24, 26 attached thereto. The first extrusion 24 includes a cam surface 28, and is fixed to the printed circuit board 10 by fasteners 30. The second extrusion 26 is mated with the first extrusion 24 by a clasp 32. The clasp arrangement allows the second extrusion 26 to move laterally approximately 0.060 inches with respect to the first extrusion 24. A cam member 34 is disposed between the first extrusion 24 and the second extrusion 26. Rotation of the cam member 34 about the cam surface 28 causes the second extrusion 26 to move either into or away from the first extrusion 24.

The printed circuit board 10 further includes a plurality of signal receiving locations 36 distributed along the lower edge. The number and location of these signal receiving locations is dependent upon the number of additional connections desired between the mother board and the printed circuit board 10. The printed circuit board 10 also includes a contact guide 38 attached by fastener 40.

The configuration of the first and second extrusions 24, 26 create an interior channel 42 for engaging a third extrusion carrying a plurality of electrical contacts from the mother board or card cage 52.

Figure 3:
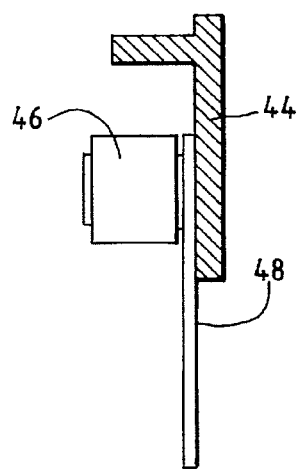
FIG. 3 is an end view of an extrusion fixed to the card cage.

FIG. 3 shows a third extrusion 44 fixed to a plurality of electrical contacts from the mother board or card cage (not shown). The representative contact 46 receives signals or power from below via a ribbon cable 48 or flexible printed circuit board. In the preferred embodiment, the contacts 46 are constant mating force contacts such as those known and commercially available.

One example of such a contact is the Cin-apse contact manufactured by the Cinch Corporation. These contacts are preferable because they have no insertion or extraction force. The Cin-apse contacts 46, while having very low impedance and high density, are not tolerant of any longitudinal rubbing or wiping action. The present card connection system thus allows for the contacts 46 to be pressed onto the printed circuit board 10 to make electrical contact, and held away from the printed circuit board during insertion or extraction.

Although Cinch Cin-apse contacts are preferred, any of a multitude of electrical contacts could be used including elastomeric connectors and simple pins and sockets.

In operation, the printed circuit board 10 is slid into the card cage such that the first, second, and third extrusions 24, 26, 44 mate. In other words, the interior channel 42 created by the first and second extrusions 24, 26 on the printed circuit board engage the third extrusion 44 of the card cage as shown in FIG. 4.

Figure 4:
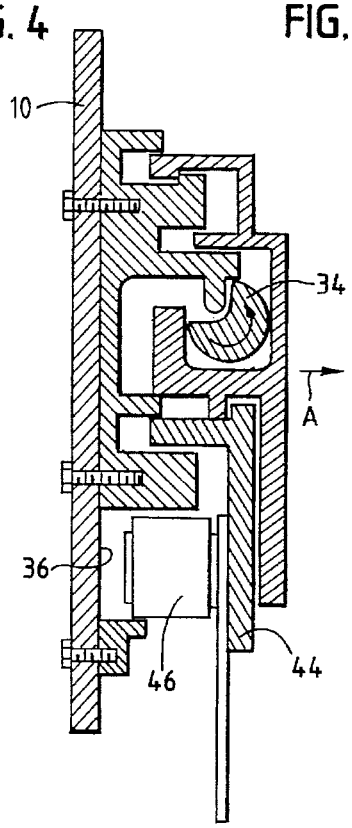
FIG. 4 is an end view of the card connection system of the present invention in the insertion/extraction position.

Referring to FIG. 4, the cam member 34 is shown in the insert/extract position. In this position, the contacts 46 carried by the third extrusion 44 are held away from the signal receiving locations 36 of the printed circuit board 10. Accordingly, there is no longitudinal rubbing or wiping action on the contacts 46 during insertion or extraction of the printed circuit board 10.

Figure 4A:
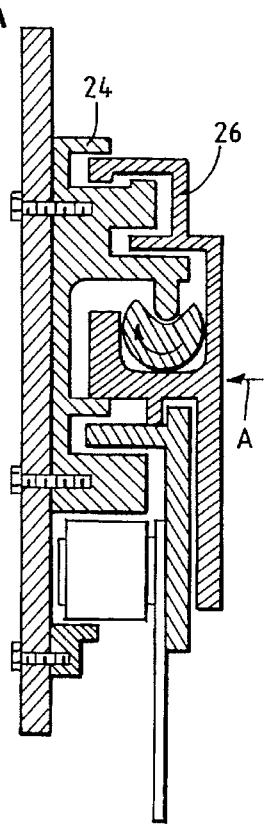
FIG. 4A is an end view of the card connection system of FIG. 4 with the cam member partially rotated.
Figure 4B:
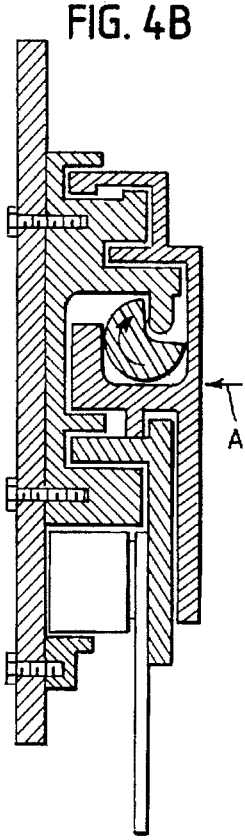
FIG. 4B is an end view of the card connection system of FIG. 4 with the cam member fully rotated and the electrical contacts engaged.

Once the printed circuit board 10 is installed, the cam member 34 is rotated as shown in FIG. 4a. Rotation of the cam member 34 forces the first and second extrusions 24, 26 together which, in turn, pull the third extrusion 44 and corresponding contacts 46 toward the printed circuit board 10 in the direction of the longitudinal arrow A. With the cam member 34 fully rotated into the locked position as shown in FIG. 4b, the contacts 46 and signal receiving locations 36 are electrically engaged. This process is also depicted isometrically in FIGS. 8, 8a, and 8b.

To remove the printed circuit board 10, the cam member 34 can be rotated back to the insert/extract position to hold the contacts 46 away from the printed circuit board 10.

Since the extrusions and the cam member 34 run the entire length of the printed circuit board, the mating force is applied along the entire edge of the printed circuit board. Thus, even minor warpage of the circuit board does not effect the integrity of the electrical connection. The extrusions insure compliant contact along the length of the circuit board. Longitudinal alignment is achieved by placing alignment pins at several points along the length of the circuit board.

The Cin-apse contacts of the preferred embodiment are available in many densities and can be obtained in custom configurations. More than 1000 connections can easily be brought onto the bottom edge of the printed circuit board. The present card connection system can also be used on the top edge of the board to provide an even greater number of connections.

Figure 5:
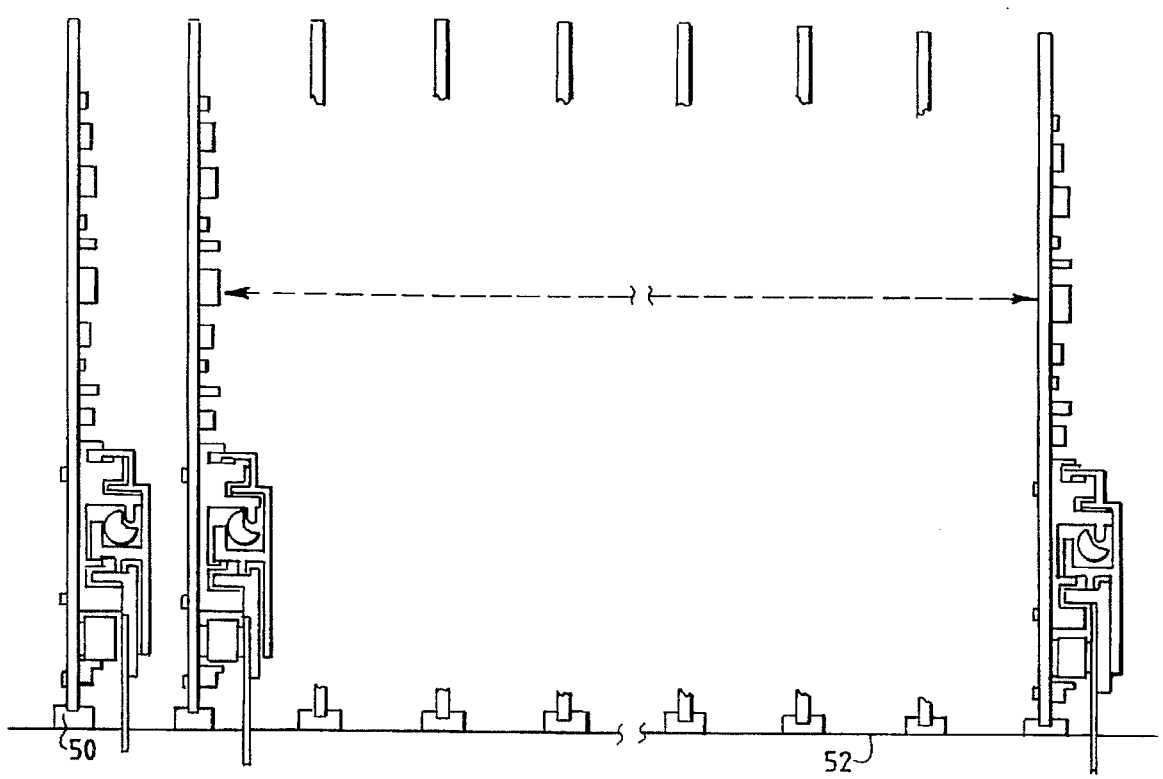
FIG. 5 is a partial view of a card cage including an array of circuit boards employing the card connection system of the present invention.

As shown in FIG. 5, the present card connection system can be accomplished in a space less than 0.5 inches in width. The present card connection system thus provides adequate space for air flow between the circuit boards.

Other variations of the present card connection system will suggest themselves to persons skilled in this technical field. For example, the extrusions could be of any configuration depending upon space limitations and the relevant amount of lateral movement desired. Likewise, it is readily understood that the present card connection system could be used along any edge of a removable printed circuit board.

The present zero insertion/extraction force card connection system has a simplified construction and allows for increased electrical connections relative to previous systems. The present card connection system provides an economical solution to the need for more signal connections. The present card connection system solves the problem of hard wiring more connections or being limited by the connections available on the backplane of the card cage.

The present card connection system provides several advantages over present card connectors. A greater number of connections are provided between the circuit board and mother board. In addition to the backplane, connections can be made along the top of bottom edges of the circuit board. Further, the present connection system allows for zero insertion/extraction force from the front of the card cage, as is typical with many standardized formats today.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. An electrical connector for introducing electrical signals to a circuit board comprising:

(a) a first extrusion attached to an edge of a circuit board having a plurality of electrical signal receiving locations along said edge of the circuit board, the first extrusion having a cam surface;

(b) a second extrusion coupled to the first extrusion, the first and second extrusions defining an interior channel having a longitudinal length and an opening at one end of said longitudinal length;

(c) a cam member disposed between the first and second extrusions rotatably engaging the cam surface such that rotation of the cam member urges the second extrusion between first and second positions; and, (d) a third extrusion attached to a housing for receiving the circuit board, the third extrusion being inserted through said opening and moved along said length of said channel, the third extrusion including a plurality of electrical contacts;

wherein movement of the second extrusion into the first position urges the plurality of electrical contacts apart from the plurality of electrical signal receiving locations and movement of the second extrusion into the second position urges the plurality of electrical contacts to engage the plurality of electrical signal receiving locations.

2. The electrical connector of claim 1 wherein the plurality of electrical contacts are constant mating force contacts.

3. The electrical connector of claim 1 wherein the distance between the first and second positions is approximately 0.060 inches.

4. The electrical connector of claim 1 wherein said third extrusion moves along a longitudinal length of said channel as the circuit board is inserted into the housing.

5. The electrical connector of claim 1 wherein said channel extends along a length of said second extrusion, said open end being located proximate one end of said length.

6. A method of providing electrical connections to a circuit board comprising the steps of:

(a) attaching a first extrusion to an edge of a circuit board having a plurality of electrical signal receiving locations along said edge of the circuit board, the first extrusion having a cam surface;

(b) mating a second extrusion to the first extrusion, the first and second extrusions defining an interior channel having a longitudinal length and an opening at one end of said longitudinal length;

(c) positioning a cam member between the first and second extrusions rotatably engaging the cam surface such that rotation of the cam member urges the second extrusion between first and second positions;

(d) attaching a third extrusion to a housing for receiving the circuit board, the third extrusion having a plurality of electrical contacts;

(e) while the cam member is rotated to urge the second extrusion into the first position, inserting the third extrusion through said opening and moving said third extrusion alone said length of said channel such that the plurality of electrical contacts align with and oppose the plurality of electrical signal receiving locations; and (f) rotating the cam member to urge the second extrusion into the second position such that the plurality of electrical contacts engage the plurality of electrical signal receiving locations.

7. The method of claim 6 wherein the plurality of electrical contacts are constant mating force contacts.

8. The method of claim 4 wherein said third extrusion moves along a longitudinal length of said channel as the circuit board is inserted into the housing.

9. The method of claim 4 wherein said channel extends along a length of said second extrusion, said open end being located proximate one end of said length.

\* \* \* \* \*